(12) United States Patent
Fedeli et al.

(10) Patent No.: US 7,482,184 B2
(45) Date of Patent: Jan. 27, 2009

(54) MANUFACTURE OF A LAYER OF OPTICAL INTERCONNECTION ON AN ELECTRONIC CIRCUIT

(75) Inventors: Jean-Marc Fedeli, Saint Egreve (FR); Lea Di Cioccio, Saint Ismier (FR)

(73) Assignee: Commissariat a l'Energie Atomique, Paris (FR)

( * ) Notice: Subject to any disclaimer, the term of this patent is extended or adjusted under 35 U.S.C. 154(b) by 275 days.

(21) Appl. No.: 11/080,645

(22) Filed: Mar. 16, 2005

(65) Prior Publication Data

US 2006/0001038 A1    Jan. 5, 2006

(30) Foreign Application Priority Data

Mar. 17, 2004   (FR) .................................. 04 50535

(51) Int. Cl.
*H01L 21/00* (2006.01)
(52) U.S. Cl. .............................. 438/29; 438/27; 438/31; 438/32; 438/35; 257/95; 257/98
(58) Field of Classification Search ............... 438/31, 438/48, 29, 35, 32, 65, 16, 27; 257/13, 84, 257/94, 103, 184, 431, 432, 95, 98
See application file for complete search history.

(56) References Cited

U.S. PATENT DOCUMENTS

| 2002/0036055 A1* | 3/2002 | Yoshimura et al. ........... 156/234 |
| 2003/0110808 A1* | 6/2003 | M'Saad et al. ................. 65/379 |
| 2004/0013338 A1* | 1/2004 | Bjorkman et al. .............. 385/14 |
| 2005/0175286 A1* | 8/2005 | Patel et al. ..................... 385/43 |

FOREIGN PATENT DOCUMENTS

| EP | 1 041 418 A2 | 10/2000 |
| WO | WO 2004/010192 A2 | 1/2004 |

OTHER PUBLICATIONS

A. Georgakilas, et al., "Wafer-scale integration of GaAs optoelectronic devices with standard Si integrated circuits using a low-temperature bonding procedure", Applied Physics Letters, XP-001144665, vol. 81, No. 27, Dec. 30, 2002, pp. 5099-5101.

* cited by examiner

*Primary Examiner*—Zandra Smith
*Assistant Examiner*—Sonya D McCall Shepard
(74) *Attorney, Agent, or Firm*—Oblon, Spivak, McClelland, Maier & Neustadt, P.C.

(57) ABSTRACT

The invention relates to a method for manufacturing an optoelectronic device comprising: a step for manufacturing optical guiding means; a step for assembling these means with electronic circuit means and generating optically active means on top of this assembly.

14 Claims, 5 Drawing Sheets

MANUFACTURE OF A LAYER OF OPTICAL INTERCONNECTION ON AN ELECTRONIC CIRCUIT

TECHNICAL FIELD AND THE PRIOR ART

The invention relates to the field of optoelectronic devices, notably that of photonics on silicon, and in particular the making of optical interconnections on silicon chips for the distribution of intra chip signals.

It also relates to techniques for guiding light in high index guides, to the millimicron.

The invention notably applies to the field of optical interconnections, intra chip optical connections, optical telecommunication, integrated optical sensors.

Using "photonics on silicon" type techniques, we have been trying to make optical functions with high integration on silicon.

In a standard approach, we have transmitters coupled to a set of guides, this set performing an optical function, either passively or according to an electric drive.

These guides terminate at optical detectors which electrically produce the result of the optical function.

To diffuse an optical signal on the chip, as for example in the case of a clock optical distribution, the optical function is in the shape of a shaft constituted of dividers and sweeps. The entire optical system, illustrated in FIG. 1, is composed of the following elements:
  an optical transmitter 2 (light emitting diode or laser diode) coupled to a sub-micron guide with a high index,
  a distribution shaft 6,
  optical detectors 8, 10 coupled to the ends of each timing shaft.

The document by A. Georgalikas et al. entitled "Wafer scale integration of GaAs optoelectronic devices with standard Si integrated circuits using a low-temperature bonding procedure", Applied Physics Letters, Vol. 81, Nr 27, December 2002 discloses a method for manufacturing an optoelectronic device comprising a step of bonding a board containing AsGa heterostructures onto a planarised CMOS circuit. This bonding is created via SOG. Then the AsGa substrate is removed. The generating of the guide and of metalisation, for the diode laser and the optical detector are made in the layers of the heterostructure. This method does not allow for the decoupling of the optical guiding part from the optoelectronic part (the latter part comprising transmission and optical detection). This notably excludes the use of guides made in silicon.

We are currently searching for other types of methods that allow to make optoelectronic components comprising an optical guiding part, active optical means, such as transmitters and detectors, and an electronic substrate or comprising one or several electronic components, such as, for example, a CMOS circuit.

It thus poses the problem of finding other methods for manufacturing such components.

Yet another problem is that of electromagnetic coupling between the optical guiding means and the optically active means such as the optical detector(s) and/or the transmitters.

PRESENTATION OF THE INVENTION

The purpose of the invention is to resolve the aforementioned difficulties by simplifying manufacturing.

The invention firstly relates to a method for manufacturing an optoelectronic device, comprising:

a—a step for manufacturing optical guiding elements, in a superficial layer of a composite substrate, comprising a support substrate, an oxide interlayer, whose material has a lower index than that of the superficial layer, and the superficial layer, b—a step for assembling these elements with the electronic circuit means, c—a step for removing the support substrate, d—the generating of optically active means on top of this assembly, on the interlayer, said interlayer having a thickness ensuring proper electromagnetic coupling between the optically active means and the guiding elements.

This method implements a reduced number of technological steps.

The prior assembly of the layer comprising the optical guiding elements, or a layer containing these guiding elements, with the electronic circuit notably allows a simple monitoring of the distance between the guiding elements and the optically active means.

The support substrate is, for example, made in a semiconductor material, notably in silicon, the oxide interlayer (notably an oxide of the semiconductor material of the support substrate) has, for example, an optical index generally less than 1.6.

The composite substrate is, for example, of SOI type with a support substrate made in silicon, a layer of thermal oxide which corresponds to the interlay of low optical index and a superficial layer made in single-crystal silicon.

The superficial layer can be made in a polymer or in a nitride or in a polycrystalline silicon.

The layer of oxide can have a thickness of between 50 nm and 1 μm, advantageously between 50 nm and 400 nm.

Step b) can be performed using molecular adhesion or via the SOG ("spin on glass") method or via bonding using a polymer, for example BCB or via metallic or eutectic bonding.

The optically active means can be in III-V type materials. These means comprise, for example, one or several laser transmitters and/or one or several optical detectors.

Step d) can comprise an assembly step via molecular adhesion.

More precisely, according to an embodiment, step d) comprises:

d1—an assembly of a composite substrate with the assembly of the optical guiding elements and the electronic circuit means, this step can be obtained via molecular adhesion assembly, d2—a generating of the optically active means in the composite substrate.

The optically active means can be made by etching the composite substrate.

The method can further comprise a packaging step in a layer of constituent material of the interlayer, with a low optical index, such as for example silicon dioxide.

The invention allows a very small distance d to be obtained (for example about 100 nm) between the guide and the top of the upper surface of this low index layer of material, this distance d can be maintained between +/−10 nm over the entire board in the case of a thermal oxide. We thus obtain good electromagnetic coupling between the optical guiding elements and the optically active means such as the optical detector(s) and/or the transmitter(s).

The invention also relates to an optoelectronic device comprising optical guiding elements, contained between the electronic circuit means and the optically active means.

An interlayer of oxide, made in a material of low optical index, generally less than 1.6, separates the optical guiding elements from the optically active means. The thickness of the layer of oxide is such that it allows for proper electromagnetic coupling between the optical guiding elements and the optically active means. The interlayer has, for example, a thickness of between 50 nm and 1 μm, advantageously between 50 nm and 200 nm or between 50 nm and 400 nm.

Preferably a distance of at least 1 μm separates the optical guiding elements from the electronic circuit means.

The constituent materials of this device are those already mentioned in association with the above method.

DESCRIPTION OF SPECIFIC EMBODIMENTS

An example of a method according to the invention is illustrated in FIGS. 2A-2I.

A bare SOI board is composed of a silicon 60 substrate topped with a thermal oxide 62 with a thickness similar to the desired value, for example in the range of 50 nm-1 μm, advantageously between 50 nm and 400 nm, for the distance d between the optical guide and the optically active means.

By way of example, the SOI board has a layer 62 of thickness d equal to about 100 nm, with an evenness of +/−10 nm.

Figure 2A:
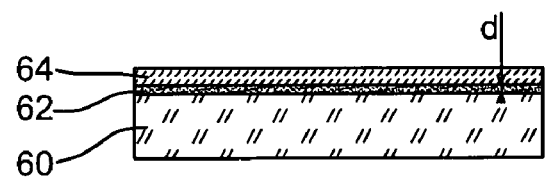
FIGS. 2A-2I represent steps of a method according to the invention.

The layer of silicon 64 itself has a thickness of between, for example, 100 nm and 500 nm (FIG. 2A).

Figure 1:
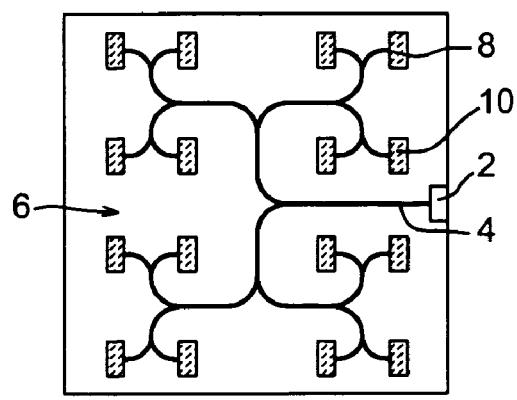
FIG. 1 represents a known device.
Figure 2B:
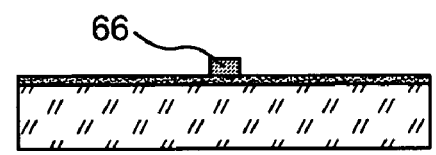
Figure 2C:
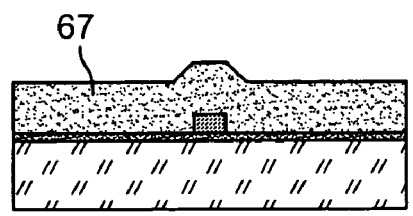

Optical guiding elements 66 are then made via photolithography and etching (FIG. 2B) of the layer 64. These elements are shown in a cross section in FIG. 2B and can be perpendicularly extended along the plane of this figure. In addition, only the guide is represented in FIG. 2B, but a network of guides such as that in FIG. 1 can also be produced.

We thus create a deposit of a layer of silica 67, for example via PECVD.

This layer 67 allows to package the guide or the guiding elements in a low index material.

Figure 2D:
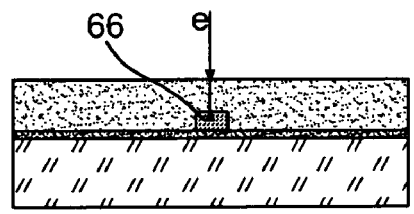

We perform mechano-chemical polishing in order to obtain a flat surface (FIG. 2D).

Preferably, the thickness e above the guide 66 is greater than 1 μm so as to avoid optical losses after assembling.

Figure 2E:
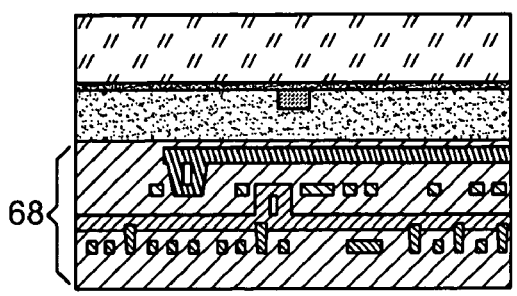

This substrate comprising the optical guides 66 is then bonded onto a board 68 containing electronic circuits, for example of CMOS type (FIG. 2E). The bonding can be done via molecular adhesion, or via other types of bonding, for example via SOG ("spin on glass") or via a polymer, for example, BCB or via eutectic bonding.

Figure 2F:
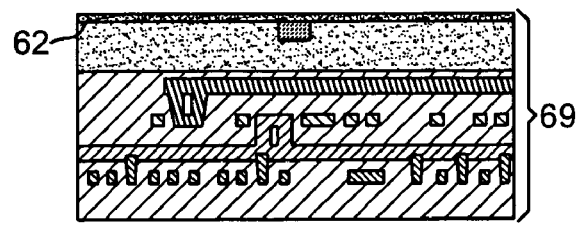

We thus remove the silicon substrate 60 down to the surface of the layer 62 (FIG. 2F). We obtain an optoelectronic component 69.

We then assemble the active optic components 70 via, for example, molecular adhesion. The components 70, at least one light source such as, for example, a laser transmitter and/or one or several photodetectors, are for example made in III-V materials. An embodiment of such components 70 will be described in greater detail in connection with FIGS. 3A-3H.

These materials can then undergo lithography or etching, the latter are then packaged (FIG. 2G) in a layer 71, for example in silica.

We then etch the different layers of silica (FIG. 2H) in order to create openings 72, 74 on the electrodes 76 and the metal parts 78, 80 of the circuit board 68.

Figure 2G:
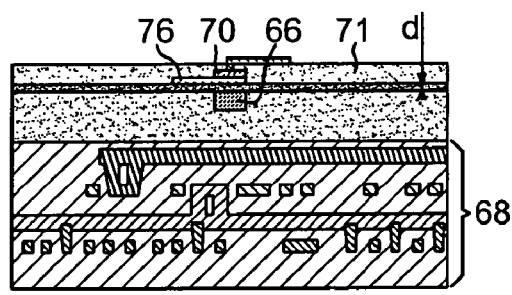
Figure 2H:
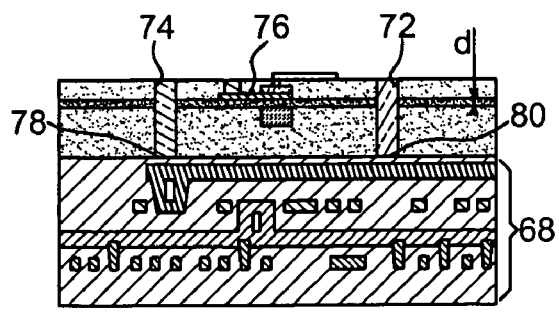
Figure 2I:
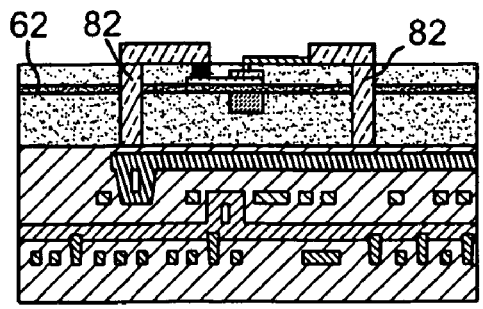

We then connect the electrodes and the CMOS circuit via a metallic deposit 82 (FIG. 2I).

Finally, the assembly of active components (transmitters and/or photodetectors) is performed on the layer of oxide 62. The distance d, between the guide and the optically active means 70, is perfectly defined by the thickness of this layer of oxide 62: the latter can be thin, for example about 70 nm to 420 nm.

In the case of thermal oxide, the thickness of the oxide can be monitored irrespective of the value of the distance d to within +/−10 nm at the scale of a substrate (8 inches), which ensures optimum bonding over the entire substrate, thus ensuring good manufacturing efficiency, particularly advantageous in respects to an industrial process.

A short distance d, for example in the above range, ensures proper electromagnetic coupling between the guide and each related photodetector or transmitter.

If the distance d is still to great, the layer 62 can be thinned out using microelectronic chemical or plasma etching techniques (for example after the step in FIG. 2F) which again allow to remove a thin thickness of silica, generally about 100 nm, with great precision.

In other words, the prior assembly of the layer comprising the optical guiding means with the electronic circuit 68 allows for simple monitoring of the distance d, before assembly with the optically active means.

In the case of a transfer via molecular adhesion, such as that in FIG. 2E, it is advantageous to perform this bonding on a thermal oxide. Indeed the structural quality of the thermal oxide allows very good quality bonding to be obtained.

The tolerances for the oxide deposit 67 as well as for the polishing of this layer of oxide are relaxed (thickness after polishing preferably greater than 1 μm) and it is not necessary to monitor the thickness after polishing.

According to this method, the number of technological steps is reduced.

FIGS. 3A-3H illustrate an example of manufacturing active optical components from an active board comprising a substrate 170 made in InP, a superficial layer 172 made in InGaAs, a heterostructure 174 (that being a stack of alternating layers of different components) with a thickness of a few hundred nm, for example between 300 nm and 700 nm, for example 500 nm, a contact zone 176 (for example with a thickness of about 100 nm), and a layer of silica 178 (for example with a thickness of about 10 nm).

This board is assembled (FIG. 3B) with the existent assembly 69, illustrated in FIG. 2F, guiding elements and electronic components. The assembly implements bonding via molecular adhesion of the two boards.

Figure 3A:
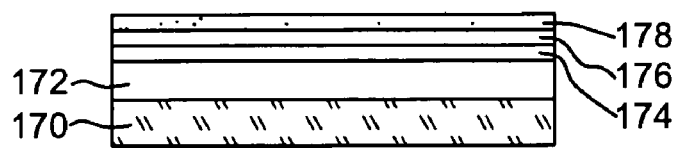
FIGS. 3A-3H represent steps for manufacturing light sources with a board on an InP substrate.
Figure 3B:
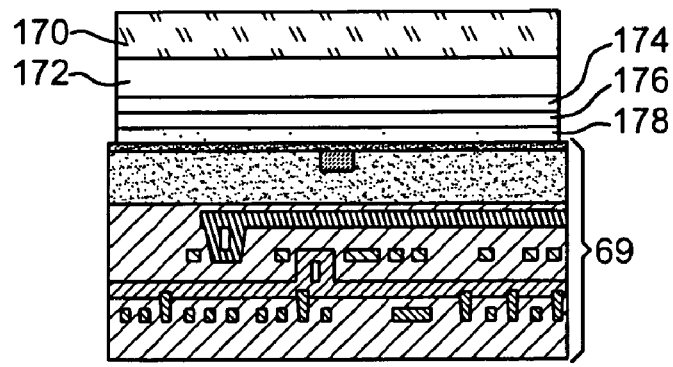
Figure 3C:
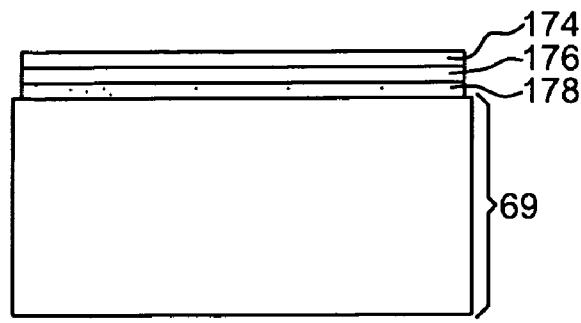
Figure 3D:
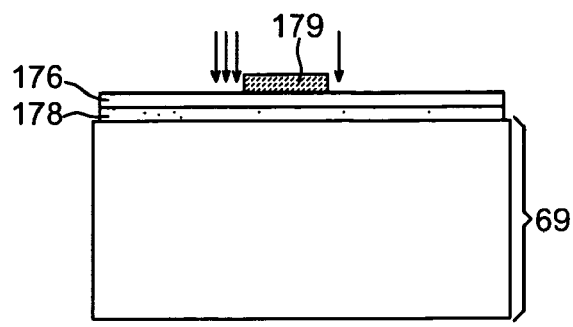
Figure 3E:
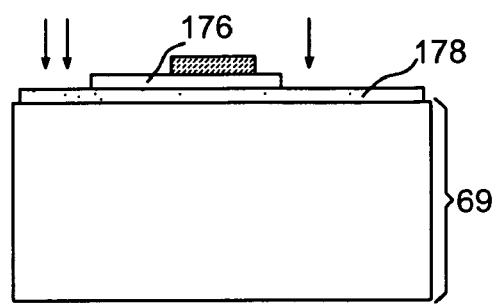
Figure 3F:
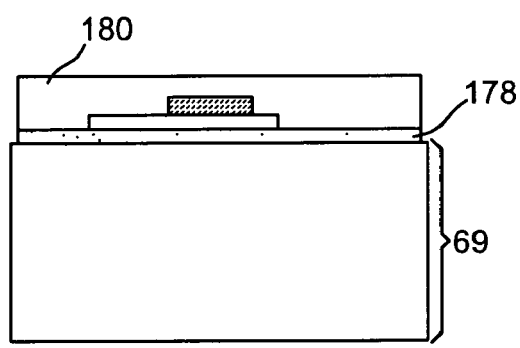
Figure 3G:
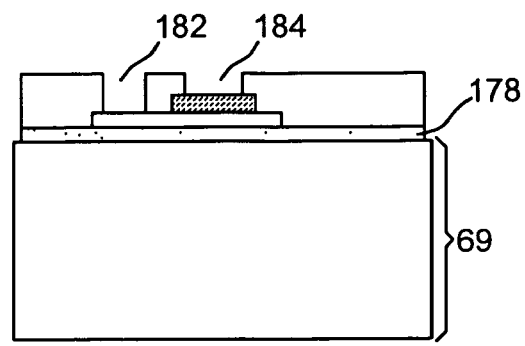

Then the InP substrate 170 and the superficial layer 172 are removed (FIG. 3C).

Lithography and etching of the heterostructure 174 (FIG. 3D) can then possibly be performed so as to create the desired component 179, for example an active component such as a light source (laser diode or micro-laser) or a detector.

Then lithography or etching of the layer 176 of the lower contact (FIG. 3E) can be performed.

A planarisation step can then take place (FIG. 3F) by depositing a layer 180 of polymer such as, for example, BCB.

Figure 3H:
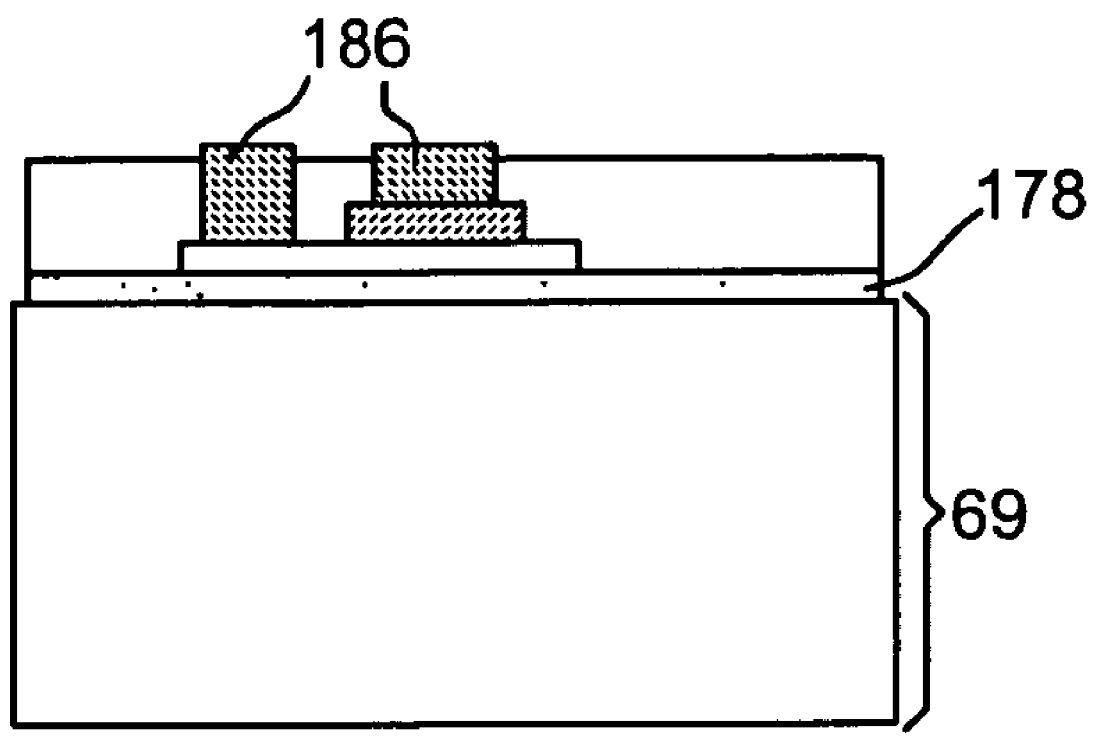

Then openings 182, 184 are made in this layer (FIG. 3G) and metal 186 is deposited to create the lower and upper contacts (FIG. 3H).

We thus obtain the device illustrated in FIG. 2G.

Despite the layers 176 and 178, the distance between the guide and the optically active means 179 can still be easily monitored due to, as mentioned above, the prior assembly of the layer comprising the optical guiding means with the electronic circuit.

The example given was of a layer 64 made in single-crystal silicon, but it could be a layer made in another material, of greater index to that of the layer of oxide 62, for example a polymer or a nitride or a layer of polycrystalline silicon.

The invention claimed is:

1. Manufacturing method of an optoelectronic device, comprising:
    a—manufacturing optical guiding elements in a superficial layer of a composite substrate, said composite substrate comprising a support substrate, an oxide interlayer provided on the support substrate and the superficial layer provided on a first side of the oxide interlayer, the material of the oxide interlayer having a lower optical index than that of the superficial layer,
    b—assembling the composite substrate with an electronic circuit means to form an assembly having the support substrate as an outermost layer,
    c—removing the support substrate, and
    d—generating optically active means on a second surface of the oxide interlayer of the assembly such that the oxide interlayer is interposed between the active means and the superficial layer, said interlayer having a thickness of from 50 nm to 1 µm in order to ensure proper electromagnetic coupling between the optically active means and the guiding elements through the oxide interlayer.

2. The method as set forth in claim 1, the support substrate being made in a semiconductor material.

3. The method as set forth in claim 1, the interlayer, with a lower optical index than that of the superficial layer, being made in an oxide of the semiconductor material.

4. The method as set forth in claim 1, the interlayer, with a lower optical index than that of the superficial layer, being made in an oxide of the semiconductor material, said oxide being a thermal oxide.

5. The method as set forth in claim 1, the interlayer, with a lower optical index than that of the superficial layer, having an index lower than 1.6.

6. The method as set forth in claim 1, the composite substrate being of SOI type.

7. The method as set forth in claim 1, the superficial layer being made in a polymer or a nitride or a polycrystalline silicon.

8. The method as set forth in claim 1, further comprising packaging the guiding element in a layer of the material of the interlayer.

9. The method as set forth in claim 1, the step b) being performed using molecular adhesion, or via the SOG method, or via a polymer, or via metallic or eutectic bonding.

10. The method as set forth in claim 1, the step d) comprising:
    d1—an assembly of an active board with the assembly made of the optical guiding elements and the electronic circuit means, and
    d2—a generating of the optically active means in the active board of this assembly.

11. The method as set forth in claim 1, the step d) comprising:
    d1—an assembly of an active board with the assembly made of the optical guiding elements and the electronic circuit means, and
    d2—a generating of the optically active means in the active board of this assembly, and the active board comprising a stack of III-V materials.

12. The method as set forth in claim 1, the step d) comprising:
    d1—an assembly of an active board with the assembly made of the optical guiding elements and the electronic circuit means via molecular adhesion,
    d2—a generating of the optically active means in the active board of this assembly.

13. The method as set forth in claim 1, the step d) comprising:
    d1—an assembly of an active board with the assembly made of the optical guiding elements and the electronic circuit means,
    d2—a generating of the optically active means in the active board of this assembly, via etching of the active board.

14. The method as set forth in claim 1, the interlayer having a thickness between 50 nm and 400 nm.

* * * * *